Figure 1:
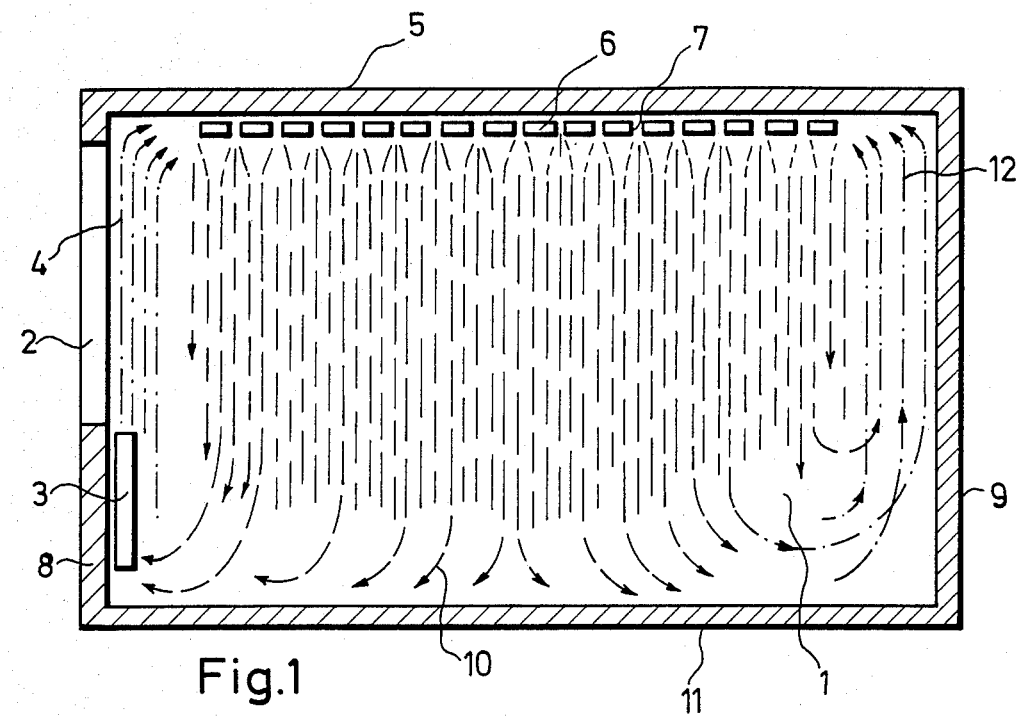

United States Patent [19]

Bollinger

[11] Patent Number: 4,492,086

[45] Date of Patent: Jan. 8, 1985

[54] AIR CONDITIONING SYSTEM FOR HEATED ROOMS

[76] Inventor: Viktor Bollinger, Nordstrasse 29, D-5620 Velbert 1, Fed. Rep. of Germany

[21] Appl. No.: 434,498

[22] Filed: Oct. 15, 1982

[51] Int. Cl.³ ............................................. F25B 21/02
[52] U.S. Cl. .......................................................... 62/3
[58] Field of Search ............................................... 62/3

[56] References Cited

U.S. PATENT DOCUMENTS 3,087,309  4/1963  Toulmin, Jr. ............................. 62/3
3,138,934  6/1964  Roane ....................................... 62/3

*Primary Examiner*—Lloyd L. King
*Attorney, Agent, or Firm*—Auslander & Thomas

[57] ABSTRACT

An air-conditioning passive heat recirculating system for heated rooms has a number of heat exchange elements with heat radiation surfaces operating as heat transfer pumps using the Peltier's effect. Said heat exchange elements are arranged at at least one wall or the ceiling of heated room within the flow of the heated air circulating in said room so that their radiation surfaces direct heat from said wall or ceiling area to other parts of the room where the heat is desired and needed.

4 Claims, 3 Drawing Figures

U.S. Patent   Jan. 8, 1985   4,492,086

AIR CONDITIONING SYSTEM FOR HEATED ROOMS

The invention relates to an air conditioning system for heated rooms, having a number of heat exchange elements with heat radiation surfaces operating as heat transfer pump using the Peltier's effect, said heat exchange elements being provided at at least one wall of a heated room.

It is known that in heated rooms unsuitable temperature and climate conditions are possible since the air within said room which is heated by an oven, radiators or the like is rising upwards to the ceiling of the room and stays there more or less immovable so that a relatively high mean room temperature is necessary if it should be also warm enough near the floor of the room. Previous efforts to overcome these problems by special heating systems have not been successful since by reducing one disadvantage other disadvantages have been increased. These efforts have in many cases had the effect that unwholesome or unhealthy climate conditions arise in heated rooms.

The violent flow of air heated by known room heating methods carries a lot of dust particles so that a high dust level is produced within the room which can even be wholesome or unhealthy.

For air conditioning of rooms it is known, to provide at large wall surface heat exchange elements and their heat exchanging surfaces in order to transport heat from the ambient air into the room to be heated by using the Peltier's effect (R. Plank, Handbuch der Kältetechnik, Vol. 6, Part A, pages 501 to 503, Springer-Verlag, 1969, West Germany). This, however, involves the problem that a back flow of heat from the heated room into the ambient air is possible when the ambient temperature is low so that the heat exchangers which are contacted by the ambient air must be arranged within channels which can be closed when the ambient temperature is too low. Also, with this kind of room heating it cannot be avoided that the space below the ceiling must be overheated in order that suitable temperatures are obtained in that part of the room where persons are staying. The higher the heated rooms are the more they will be overheated in their upper portion. Especially in factory halls which must be very high a suitable and economic heating of that areas where persons stay is scarcely possible since heat is stowed below the ceiling or on the roof while near the floor cold air is coming in by steady opening and closing of doors. The cold air stays near the floor and is not mixed with the heated air in the upper portions of the room.

The object of the invention is to evenly distribute heat in heated rooms and to keep air flow as low as possible in order to reduce heating costs and to improve the room climate.

In accordance with the present invention an air-conditioning, passive heat recirculating system is proposed having a number of heat exchange elements operating as heat transfer or transport pumps using the Peltier's effect wherein the heat exchange elements are arranged within the flow of the heated air circulating in the room to be heated. The heat exchange elements operating as heat transfer pumps using the Peltier's effect are in accordance with the present invention not used to transfer heat into the heated room but to direct the heat within the heated room into those areas of said heated room in which the heat is mainly desired. The thermoelements take up heat in those part of the heated room where it is not necessary and transport it by radiation into other areas of said room. Thus it is possible to reduce the heat stow which is especially to be observed in the space directly below the ceiling of the heated room so that for a sufficient heating of that area of the room where persons stay the necessary mean room temperature can be lower than previously necessary.

The air-conditioning system of the present application uses the Peltier's effect for more evenly distributing the warm air in a heated room. Peltier has found that a DC-voltage applied to a circuit comprising of two different metallic conductors has the effect that the one connection between the two conductors is cooled while the other connection is heated. With heat transfer or heat transport pumps using this principle heat energy is extracted from the air in the vicinity of the heat exchange elements and is conducted to the radiation surfaces of the heat exchange elements.

To effect a heat transport from the heat radiation surfaces to the floor area and also to cooler walls of the heated room already a low temperature increase at the heat radiation surfaces is sufficient. The steady transport of heat from said portions of the heated room where heat is normally stowed produces a condition with the effect of an even temperature distribution in the heated room. Therefore, the necessary mean room temperature will be lower so that considerable savings of heat energy and thus also of heat costs are possible.

Since the air-conditioning, passive heat recirculating system of the present invention is used only for heat distribution and not also for obtaining the heat energy for heating the room, i.e. since it is used in addition to conventional heating systems, the surface temperature of the radiation surfaces of the heat exchange elements can be relatively low. Accordingly, no intensive heat radiation happens which is a disadvantage of known radiation heat systems. Therefore, it is possible to arrange the heat radiation surfaces of the heat exchange elements thus that they are directed to those areas to which the heat transport is desired.

Preferably the heat exchange elements are arranged below the ceiling of the heating room since usually in said area the undesired heat stow is to be observed. However, the heat exchange elements can in addition also be arranged at the side walls of the heated room. The heat exchange elements and especially the heat radiation surfaces thereof do not form an uninterrupted surface but individual elements between which a space or distance of several centimeter or inches is provided. The air which has been cooled by passing the heat exchange elements becomes heavier and descends as an air mass steadily downwards. Velocity and temperature difference of this steadily moving air mass are so small that they are not perceived or noticed by the persons within the thus climatized room. The air movement produced by the air-conditioning, passive heat recirculating system of the present invention is so low that it is not likely that dust which is especially in the floor area of the heated room will be whirled up.

The heat exchange elements can in accordance with a further feature of the invention be arranged with different inclination in order that the heat or heat energy can be directed into those areas where it is desired.

In accordance with a further feature of the invention each heat exchange element is a housing through which the air of the heated room can pass. Said housing can be a reflection hood which contains openings for the air passing or flowing through the housing.

The air-conditioning, passive heat recirculating system of the present invention can with advantage also be used where large rooms and factory halls should be heated only in certain areas. To this end it is customary to use warm air heating systems for heating purposes. However, in this manner it is scarcely possible to obtain even temperature conditions. The heat exchange elements of the present invention can be installed within the warm air flow within the higher portions of the heated room and can be thus arranged that they heat special working areas. This happens already if the temperature of the warm air passing over the heat exchange elements is much lower than the temperature of the air heated with known heating systems so that considerable savings of heating costs are obtained.

By using the air-conditioning system of the present invention the air is moved with very low velocity since the uplift of the air is not only produced by the heaters or ovens for heating the room but is to be observed at all side walls of the heated room. This has the additional advantage that all side walls are evenly and therefore better heated, that humidity deposited on the walls is removed by drying and that the radiation ratio which is necessary for a good room climate is considerably improved. On the other hand, the transport of dust particles in the rising air is reduced to a minimum.

The air-conditioning, passive heat recirculating system of the invention operates also when the room is not additionally heated. This is especially of interest during periods of transition between summer and winter when only a low additional heat demand for certain room areas is necessary.

The air-conditioning, passive heat recirculating system of the present invention distributes the heat or heat energy in a room in a building by means of heat transfer or heat transporting pumps and heat radiation surfaces. The system can be used in all heatable rooms and operates in addition to conventional heating systems which heating systems introduce heat energy into those rooms.

The most essential advantages of the present air-conditioning, passive heat recirculating system are inter alia as follows:

(a) improvement of the room climate;
(b) savings of heat energy and heat costs;
(c) obtaining adequate temperatures in rooms in summer and periods of transition;
(d) possibility to heat certain areas of a larger room which is not to be heated in total;
(e) combination with a ventilation or venting system;
(f) combination with other heat transfer pump systems.

In the drawings one embodiment of the air-conditioning system of the present invention is schematically shown but it is to be noted that the invention is not restricted to this embodiment.

Figure 2:
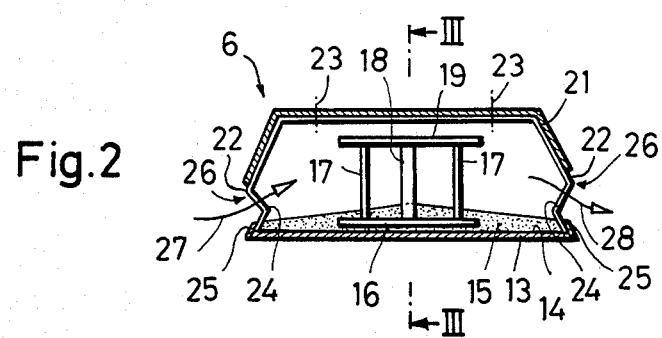
Figure 3:
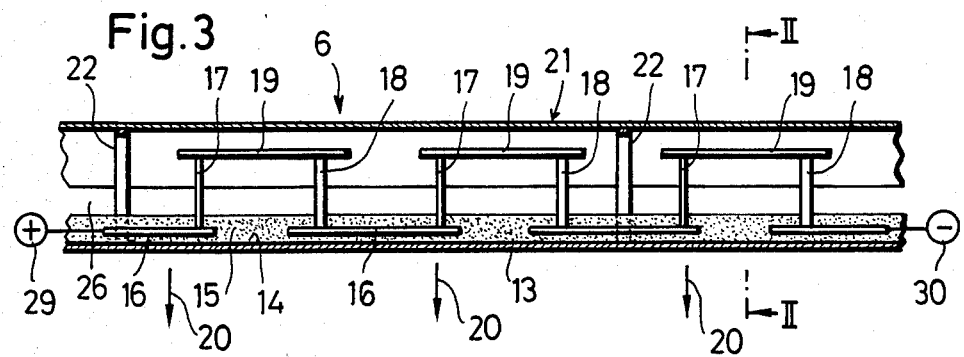

FIG. 1 shows a cross-section of a heated room wherein an air-conditioning, passive heat recirculating system of the present application is installed, FIG. 2 shows a cross-section along line II—II of FIG. 3 of one embodiment of a heat exchange element in accordance with the present invention and FIG. 3 shows a longitudinal section along line III—III of FIG. 2 through a part of the heat exchange element of the present invention which is longer than shown.

In accordance with FIG. 1 there is provided in a room 1 of a building below the window 2 a conventional heating element 3 which heats the air within said room 1 so that the heated air is flowing upwards along the side walls 8 and 9 to the ceiling 5 as indicated by arrows 4.

Below the ceiling 5 heat exchange elements 6 are arranged in a distance from the ceiling, which heat exchange elements produce a heat radiation. As shown in FIG. 1, the heat exchange elements 6 are arranged in horizontal position but it to be noted that they can be arranged also inclined under each inclination angle. The heat exchange element 6 are thus supported below the ceiling 5 that they can be adjusted in the desired position. Each heat exchange element 6 is individually adjustable so that it is possible to transport the heat radiation of each heat exchange element into 6 certain areas of room 1. Also can be taken from FIG. 1 that the individual heat exchange elements 6 are arranged in a certain lateral distance 7 from one another.

In accordance with FIG. 1 heat exchange elements 6 cover nearly the entire surface of ceiling 5. However, it is also possible to provide heat exchange elements 6 only at certain portions of ceiling 5.

Heated air moving upwards along the side walls 8 and 9 of room 1 is distributed below the ceiling 5 and is flowing around and through the heat exchange elements 6, as is explained in more detail below. When passing through the heat exchange elements 6 the heated air is cooled so that it slowly descends to the floor of room 1 as indicated by arrows 10. The flow direction of the descending air is reversed above floor 11 of room 1 so that this air which is, again heated now again flows upwards along side walls 8 and 9. The slowly descending cooled air is heated by means of the heat energy radiated from the heat exchange elements 6 and partly also by the heating element 3. Arrows 12 indicate the air flowing upwards along side walls of room 1 which are not provided with a conventional heating element 3.

In FIGS. 2 and 3 is shown that each heat exchange element 6 has a sheet metal panel 13, the outer surface thereof being a heat radiation surface. On the inner side of sheet metal panel 13 electric insulation 14 and a layer 15 of heat insulating material is provided. Also, on the rear side of sheet metal panel 13 several metal strips 16 are arranged below the heat insulating layer 15, which strips 16 transfer heat energy extracted by the heat exchange element 6 form the warm air to sheet metal panel 13. These strips 16 are connected by means of negative conductors 17 and positive conductors 18 with several metal strips 19 which are provided to extract heat energy from air flowing through heat exchange elements 6. The conductors 17 and 18 are soldered with their ends to strips 16 and 19, respectively.

Heat energy extracted by means of strips 19 from air passing over said strips 19 is transported to strips 16 and is transferred by these strips 16 to sheet metal panel 13 which transfers the heat by radiation from the outer surface of the sheet metal panel 13 into room 1 as indicated by arrows 20.

The heat exchange elements 6 are provided at their inner sides a reflection hood 21 which extends along the length of sheet metal 13 and which is connected with the sheet metal panel 13 by clips 22 made of sheet metal having a certain elasticity. Clips 22 are connected to the inner side of reflection hood 21 at connection points 23, for instance by soldering or by rivets. Clips 22 are provided with two hook-like bent ends 24 which can be inserted between upstanding rims 25 of sheet metal 13 and are held in this position by spring action, as shown in FIG. 2. Since rims 25 are inclined inwardly the hook-like ends 24 form a releasable positive connection to sheet metal 13.

Between the reflection hood 21 and sheet metal panel 13 slot-like apertures 26 are provided on both sides of heat exchange elements 6 extending along the entire length of heat exchange elements 6. Through these apertures 26 warm air can enter heat exchange elements 6 and can leave it again after cooling, as indicated by arrows 27 and 28.

As shown in FIG. 3 one end of heat exchange elements 6 is connected to the positive connection 29 and the other end to the negative connection 30 of a voltage source (not shown) so that an electric current passes through the metal strips 16 and 19 along the heat exchange element 6 so that a heat exchange in accordance with the Peltier's effect is obtained.

To obtain the Peltier's effect stripes 16 and 19 are of different metallic material as conductors 17 and 18.

I claim:

1. A passive Peltier effect room heat recirculating system including at least one longitudinal housing, said housing including an upper longitudinal reflection element, a spaced away lower longitudinal element, said upper longitudinal reflection element and said lower longitudinal radiating element spaced apart adapted to receive the flow of air through said housing, and a plurality of thermo-electric elements longitudinally aligned in said housing, said elements electrically interconnected and alternating an upper heat absorbing element and a lower heat radiation element, said heat absorbing element exposed to air flowing through said housing, said lower heat radiation element adapted to radiate heat through said lower longitudinal radiating element, whereby warm air in said housing is cooled and cool air in a room is warmed by heat radiated from said lower heat radiation element through said lower longitudinal radiating element.

2. The system of claim 1 including electrical insulation between said lower longitudinal radiating element and said lower heat radiation element.

3. The system of claim 1 wherein said lower heat radiation element is adjacent said lower longitudinal radiating element and insulated against radiating heat back into said longitudinal housing.

4. The system of claim 1 including a plurality of longitudinal housings spaced apart below the ceiling of a room.

* * * * *